(12) United States Patent
Inoue et al.

(10) Patent No.: US 7,709,870 B2
(45) Date of Patent: May 4, 2010

(54) CMOS (COMPLEMENTARY METAL OXIDE SEMICONDUCTOR) TYPE SOLID-STATE IMAGE PICKUP DEVICE USING N/P+ SUBSTRATE IN WHICH N-TYPE SEMICONDUCTOR LAYER IS LAMINATED ON P+ TYPE SUBSTRATE MAIN BODY

(75) Inventors: Ikuko Inoue, Yokohama (JP); Hiroshige Goto, Yokohama (JP); Hirofumi Yamashita, Kawasaki (JP); Hisanori Ihara, Yokohama (JP); Nagataka Tanaka, Yokohama (JP); Tetsuya Yamaguchi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 634 days.

(21) Appl. No.: 11/558,200

(22) Filed: Nov. 9, 2006

(65) Prior Publication Data

US 2007/0108487 A1   May 17, 2007

(30) Foreign Application Priority Data

Nov. 11, 2005   (JP) .............................. 2005-327601

(51) Int. Cl.
*H01L 31/113* (2006.01)
(52) U.S. Cl. ...................... 257/292; 257/231; 257/288; 257/290; 257/291
(58) Field of Classification Search .................. 257/223, 257/230, 233, 432, 435, 292
See application file for complete search history.

(56) References Cited

U.S. PATENT DOCUMENTS

| 6,072,206 | A | 6/2000 | Yamashita et al. |
| 6,448,104 | B1* | 9/2002 | Watanabe ..................... 438/60 |
| 6,521,920 | B2* | 2/2003 | Abe ........................... 257/223 |
| 7,554,141 | B2 | 6/2009 | Yamaguchi et al. |
| 2002/0063302 | A1* | 5/2002 | Furumiya et al. ........... 257/432 |
| 2006/0219867 | A1* | 10/2006 | Yamaguchi et al. ...... 250/208.1 |

FOREIGN PATENT DOCUMENTS

| JP | 2001-160620 | 6/2001 |
| JP | 2001-223351 | 8/2001 |

* cited by examiner

*Primary Examiner*—Thanh V Pham
*Assistant Examiner*—Mark A Laurenzi, III
(74) *Attorney, Agent, or Firm*—Oblon, Spivak, McClelland, Maier & Neustadt, L.L.P.

(57) ABSTRACT

A solid-state image pickup device includes a semiconductor substrate including a substrate main body having P-type impurities and a first N-type semiconductor layer provided on the substrate main body, an image pickup area including a plurality of photoelectric converters in which the plurality of photoelectric converters include second N-type semiconductor layers, the second N-type semiconductor layers being provided on a surface portion of the first N-type semiconductor layer independently of one another, and a first peripheral circuit area including a first P-type semiconductor layer formed on the first N-type semiconductor layer. The solid-state image pickup device further includes a second peripheral circuit area including a second P-type semiconductor layer formed on the first N-type semiconductor layer and connected to the substrate main body.

12 Claims, 6 Drawing Sheets

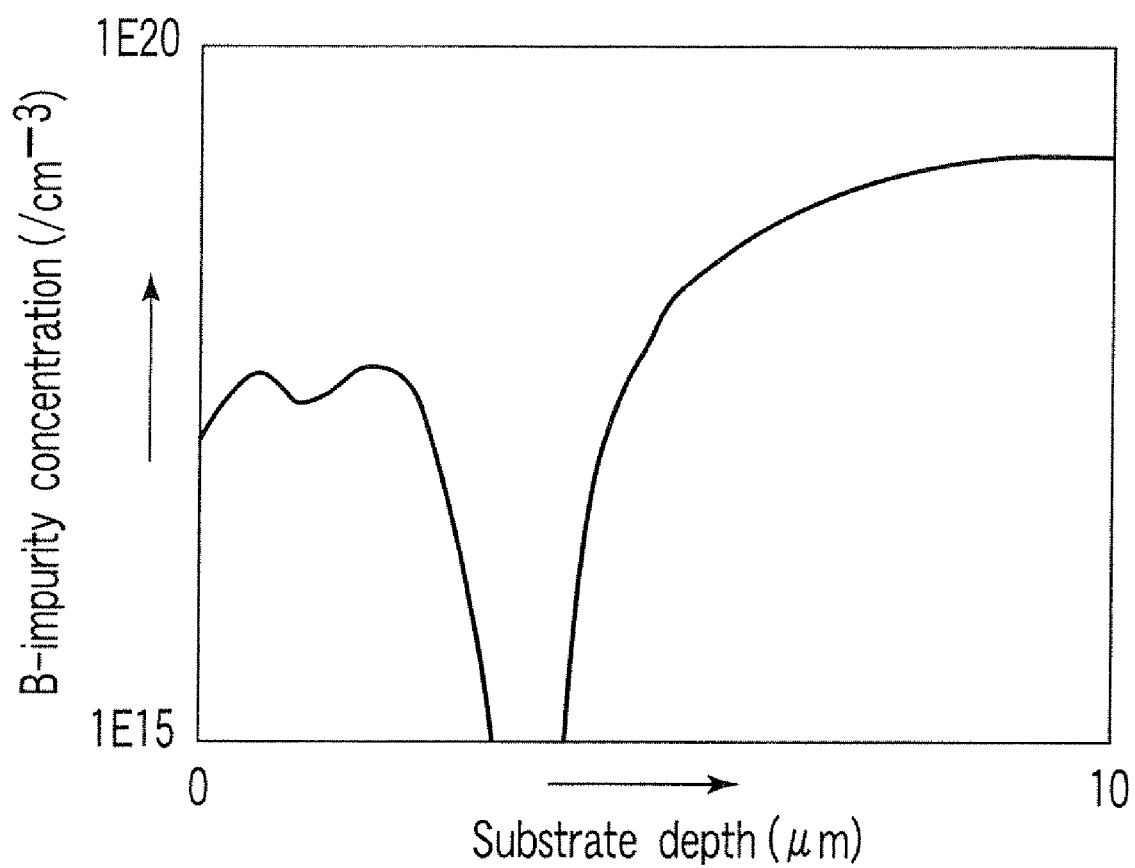
F I G. 8

CMOS (COMPLEMENTARY METAL OXIDE SEMICONDUCTOR) TYPE SOLID-STATE IMAGE PICKUP DEVICE USING N/P$^+$ SUBSTRATE IN WHICH N-TYPE SEMICONDUCTOR LAYER IS LAMINATED ON P$^+$ TYPE SUBSTRATE MAIN BODY

CROSS-REFERENCE TO RELATED APPLICATIONS

This application is based upon and claims the benefit of priority from prior Japanese Patent Application No. 2005-327601, filed Nov. 11, 2005, the entire contents of which are incorporated herein by reference.

BACKGROUND OF THE INVENTION

1. Field of the Invention

The present invention relates to an amplified type solid-state image pickup device, and particularly to a CMOS type solid-state image pickup device using an N/P$^+$ substrate, i.e., so-called CMOS image sensor.

2. Description of the Related Art

Conventionally, as a solid-state image pickup device, a charge coupled device type solid-state image pickup device (hereinafter, CCD image sensor) has been well known. A CCD image sensor is usually formed by using an N-type substrate. Further, a CCD image sensor needs three power supplies whose voltage values are different from one another to be driven. For example, three power supplies of 5 V, 8 V, and 15 V are required for driving a CCD image sensor. In a case of the CCD image sensor, a power consumption thereof is about 500 mW.

Recently, as solid-state image pickup devices, CMOS image sensors using P/P$^+$ substrates have been proposed, and have been commercialized. The CMOS image sensors have a principle of operation (features) different from that of the CCD image sensors. To describe concretely, a CMOS image sensor has features such as a single power supply, low-voltage driving, a low power consumption, and the like. For example, one power supply of 3 V is sufficient for a CMOS image sensor. A power consumption of this CMOS image sensor is about 50 mW.

In recent years, in the same way as a case of CCD image sensors, it has been significantly developed that CMOS image sensors have been made multi-pixel (high-resolution). When the number of pixels (image pickup elements) is increased without change in a size of a sensor, each pixel is naturally miniaturized. Then, an acceptance area of a photo diode in each pixel is reduced in accordance with the miniaturization of the pixels. In accordance therewith, a sensitivity of a photo diode is decreased.

In a case of a CCD image sensor, provided that depletion layers of photo diodes are enlarged, it is possible to increase a sensitivity of the photo diode. However, a CMOS image sensor is structured to be driven at a voltage lower than that of a CCD image sensor. Therefore, as compared with a CCD image sensor, it is difficult to enlarge depletion layers in photo diodes. Namely, in a case of a CMOS image sensor, it is difficult to compensate for a decrease in sensitivity which is caused by miniaturization of pixels by enlarging depletion layers of photo diodes. Accordingly, with respect to a CMOS image sensor, development of a technology in which it is possible to increase a sensitivity by a method different from that for a CCD image sensor, has been an important technical problem for future more high-resolution making (for example, refer to Jpn. Pat. Appln. KOKAI Publication Nos. 2001-160620 and 2001-223351). Further, development of a technology in which not only is it possible to merely increase a sensitivity, but also it is possible to suppress deterioration in image quality such as blooming, color mixture, and the like has been desired.

As one of countermeasures for such a problem, it has been considered to use, for example, an N/P$^+$ substrate. The reason for using an N/P$^+$ substrate is for efficiently collecting electrons generated by photoelectric conversion onto photo diodes. Namely, an N/P$^+$ substrate is structured such that, in the same way as in a case of a P/P$^+$ substrate, an N-type semiconductor layer (N-type epitaxial layer) onto which epitaxial growth has been carried out is laminated on a P$^+$ substrate. Photo diodes (N-type semiconductor layers) are formed by carrying out ion implantation of N-type impurities such as, for example, (P) phosphorus or the like, into the N-type epitaxial layer of the N/P$^+$ substrate with an accelerator. In the photo diodes formed in this way, it is easier to enlarge depletion layers than that in a case of a P/P$^+$ substrate. Therefore, it is possible to increase a sensitivity of photo diodes without increasing a driving voltage of the CMOS image sensor. In accordance therewith, it is possible to utilize a short span of lifetime of carriers, which makes it possible to prevent a deterioration in image quality such as blooming, color mixture, or the like from being brought about. Accordingly, the problem described above can be solved by manufacturing a CMOS image sensor by using an N/P$^+$ substrate.

However, unlike a case in which a CMOS image sensor is manufactured by using a P/P$^+$ substrate, in a case in which a CMOS image sensor is manufactured by using an N/P$^+$ substrate, some characteristic problems caused by an N/P$^+$ substrate are brought about.

First, there is a problem relating to isolation among photo diodes. In a P/P$^+$ substrate, a plurality of photo diodes (N-type semiconductor layers) are formed on a P-type epitaxial layer. Therefore, isolation is certainly carried out among the photo diodes by the P-type semiconductor layer which is a P-type epitaxial layer. Namely, the photo diodes are not connected to one another electrically in any case. In contrast thereto, in an N/P$^+$ substrate, a plurality of photo diodes (N-type semiconductor layers) are formed on an N-type epitaxial layer. Therefore, isolation is not carried out among the photo diodes, and a problem that the photo diodes are connected to one another electrically is brought about.

Secondly, there is a problem relating to a leak current. In a case of a P/P$^+$ substrate, the P-type semiconductor layer appears on a cut surface of each chip by a dicing process in which each of a plurality of semiconductor chips is divided from one sheet of Si (silicon) wafer. In contrast thereto, in a case of an N/P$^+$ substrate, a PN junction surface which is an interface between a P$^+$ type substrate main body and an N-type epitaxial layer appears on a cut surface of each chip. When a PN junction surface appears on a cut surface of a chip, the cut surface causes generation of a leak current, or could be a flow path of a leak current. Namely, there is increased a concern that an increase in a leak current is caused.

Thirdly, there is a problem relating to circuits disposed at a periphery of an image pickup area. As one of the features of a CMOS image sensor, there is an example in which various signal processing circuits (peripheral circuits) can be made to be an on-chip circuit along with image pickup elements. Namely, unlike CCD image sensors, because a manufacturing process for CMOS image sensors is similar to that for logic circuits, those can be manufactured on the same manufacturing line. Further, as described above, because a CMOS image sensor can be driven by a single power supply and at a low voltage, a power supply for logic circuits can be used as a driving power supply thereof. In this way, when a P/P+ substrate is used in a CMOS image sensor which can be made to be one chip, a P-well at which the peripheral circuits are formed can be grounded via the P+ type substrate main body. In accordance therewith, it is possible to make pulse signals generated in the peripheral circuits, in particular, logic circuits and an analog circuit favorable so as to have stable waveforms. Namely, when a P/P+ substrate is used, it is possible to make a CMOS image sensor be a multi-pixel or high-speed type.

In contrast thereto, when an N/P+ substrate is used, a P-well at which peripheral circuits are formed and a P+ substrate main body are isolated by an N-type epitaxial layer. Therefore, the P-well cannot be grounded via the P+ substrate main body. Namely, because a ground potential (Vss) can be taken only from the P-well, a zero potential of the P-well which cannot be grounded is unstable. Therefore, rising edges/down edges of pulses are delayed in the peripheral circuits, in particular, an analog circuit in some cases, which causes a problem that only nonrectangular pulses with unstable waveforms can be generated, or timings in generating pulses are shifted. These problems cause that a defect in image property such as vertical stripes and horizontal stripes, and the like appears in an image pickup device with the number of pixels of 2M bits or more and a high-speed image pickup device in which the number of frames in image-pickup per second is 30 frames or more.

BRIEF SUMMARY OF THE INVENTION

According to a first aspect of the present invention, there is provided a solid-state image pickup device comprising: a semiconductor substrate including a substrate main body having P-type impurities and a first N-type semiconductor layer provided on the substrate main body; an image pickup area including a plurality of photoelectric converters in which said plurality of photoelectric converters include second N-type semiconductor layers, the second N-type semiconductor layers being provided on a surface portion of the first N-type semiconductor layer independently of one another; a first peripheral circuit area including a first P-type semiconductor layer formed on the first N-type semiconductor layer; and a second peripheral circuit area including a second P-type semiconductor layer formed on the first N-type semiconductor layer and connected to the substrate main body.

BRIEF DESCRIPTION OF THE SEVERAL VIEWS OF THE DRAWING

FIG. 8 is a graph showing a characteristic of a portion taken along line VIII-VIII of the CMOS image sensor shown in FIG. 7.

DETAILED DESCRIPTION OF THE INVENTION

Embodiments of the present invention will be described with reference to the accompanying drawings. It should be noted that the drawings are schematic ones and the dimension ratios shown therein are different from the actual ones. The dimensions vary from drawing to drawing and so do the ratios of dimension. The following embodiments are directed to a device and a method for embodying the technical concept of the present invention and the technical concept does not specify the material, shape, structure or configuration of components of the present invention. Various changes and modifications can be made to the technical concept without departing from the scope and the claimed invention.

First Embodiment

Figure 1:
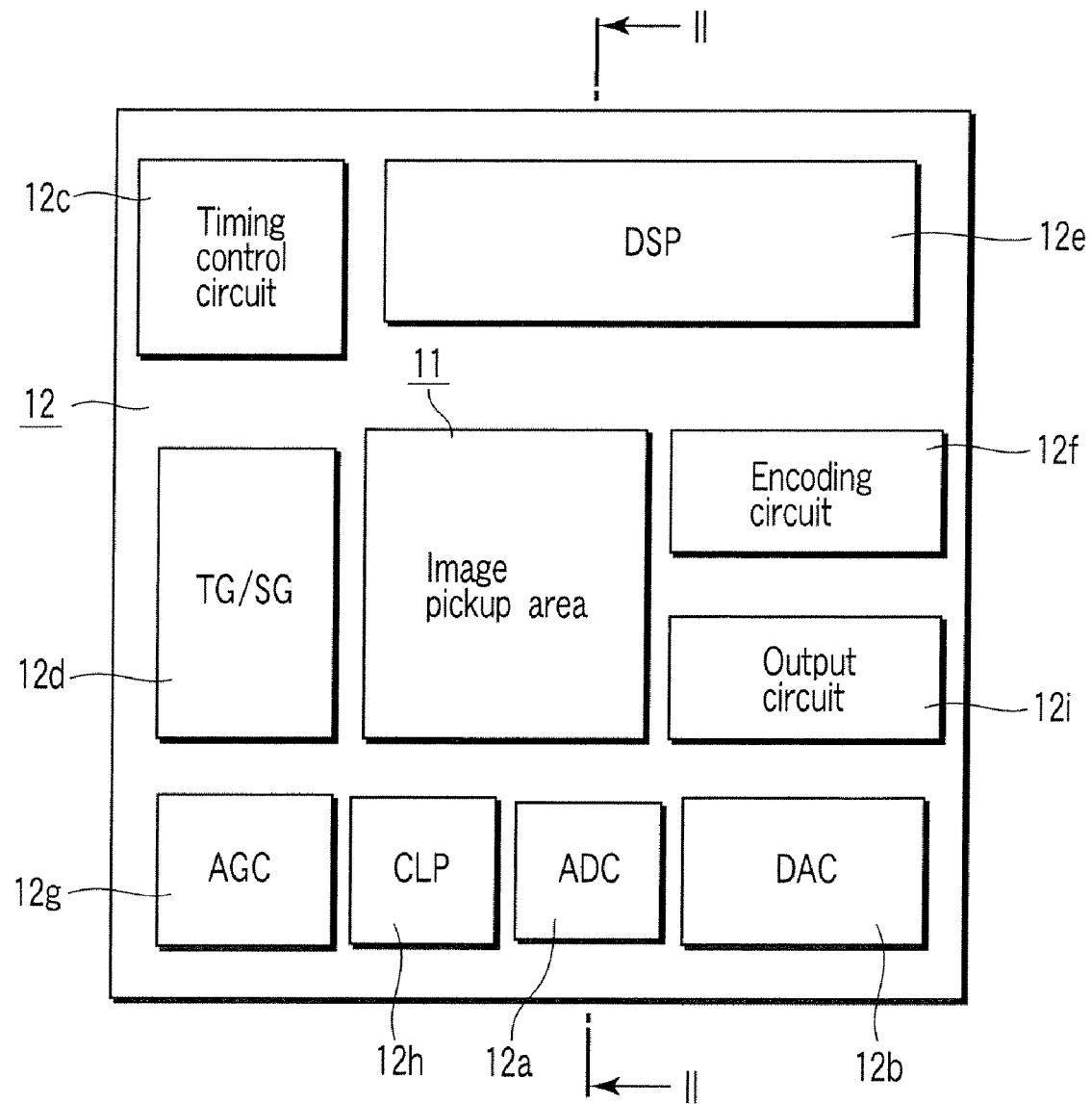
FIG. 1 is a block diagram showing one example of a CMOS image sensor using an N/P+ substrate according to a first embodiment of the present invention.

FIG. 1 shows a basic structure of a CMOS image sensor using an N/P+ substrate (an amplified type solid-state image pickup device) according to a first embodiment of the present invention. Note that, in the present embodiment, a CMOS image sensor which is made to be one chip will be described as an example.

As shown in FIG. 1, in the CMOS image sensor which is made to be one chip, an image pickup area (or a pixel section) 11 is provided. Further, in the CMOS image sensor, peripheral circuits (or peripheral processing circuits) 12 are provided. As the peripheral circuits 12, for example, an analog/digital converter (ADC) 12a, a digital/analog converter (DAC) 12b, a timing control circuit 12c, a timing generator (TG/SG) 12d, a digital signal processor (DSP) 12e, an encoding circuit 12f, an automatic gain control (AGC) circuit 12g, a clamp (CLP) circuit 12h, and an output circuit 12i are equipped. The above-described peripheral circuits 12 are respectively disposed so as to surround the periphery of the above-described image pickup area 11. Further, among the above-described peripheral circuits 12, only the ADC 12a is an analog system peripheral circuit, and the others are logic system peripheral circuits. These image pickup area 11 and peripheral circuits 12 are formed on a semiconductor substrate formed from a double-layered structure (will be described later).

Figure 2:
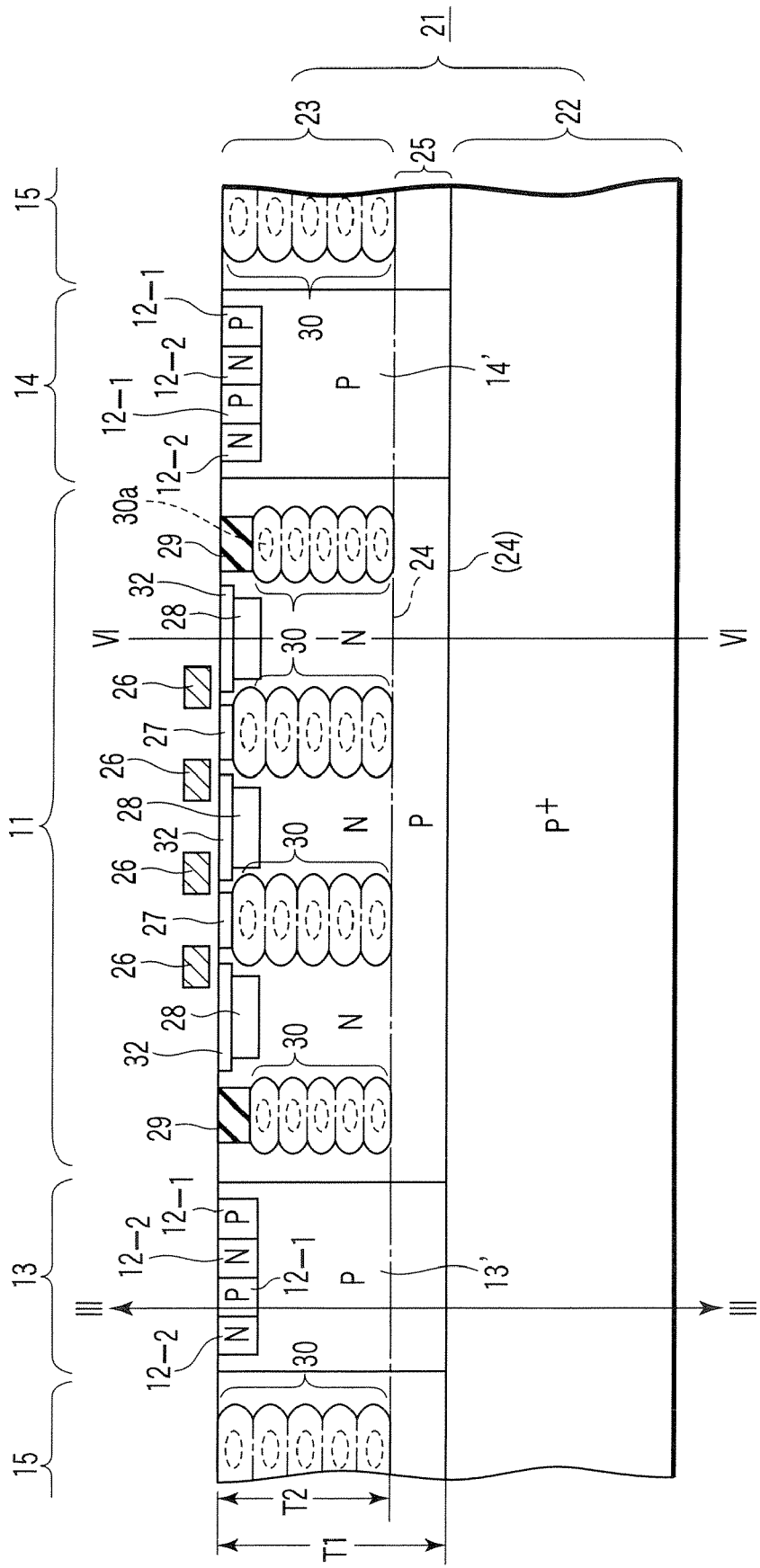
FIG. 2 is a cross-sectional view showing a configuration example of the CMOS image sensor shown in FIG. 1.

FIG. 2 shows a cross-sectional structure of the CMOS image sensor shown in FIG. 1. In the present embodiment, for example, a cross section taken along the line II-II of FIG. 1 is shown as an example. In a case of the present embodiment, a semiconductor substrate 21 has a double-layered structure. Namely, the semiconductor substrate 21 is structured such that the lower portion (lower layer portion) is a substrate main body 22 including P-type impurities. Further, the semiconductor substrate 21 is structured such that the upper portion (upper layer portion) is a first N-type semiconductor layer 23 including N-type impurities.

For example, boron (B) is included as P-type impurities in the substrate main body 22 formed from Si. Accordingly, the substrate main body 22 can be called a P-type semiconductor substrate as well. A boron concentration (P-type impurity concentration) in the substrate main body 22 is set to, for example, about $2 \times 10^{18}$ cm$^{-3}$ (2E18 cm$^{-3}$).

On the other hand, the first N-type semiconductor layer 23 is formed by epitaxial growth onto the surface of the substrate main body 22. In the present embodiment, a thickness thereof shown by a solid arrow T1 in FIG. 2 is set to 5.0 μm. Phosphorus (P) is included as N-type impurities in the first N-type semiconductor layer 23 as an epitaxial growth layer. Accordingly, the first N-type semiconductor layer 23 can be called an N-type epitaxial layer as well. A phosphorus concentration (N-type impurity concentration) in the first N-type semiconductor layer 23 is set to, for example, about $2 \times 10^{15}$ cm$^{-3}$.

In this way, the semiconductor substrate 21 has a double-layered structure in which the N-type epitaxial layer 23 is laminated on the upper surface of the P-type semiconductor substrate 22. In the following description, the semiconductor substrate 21 is to be called an N/P$^+$ substrate.

Usually, at the time of preparing the N/P$^+$ substrate, a growth rate of the N-type epitaxial layer 23 is set to about 1 μm per minute, and the N-type epitaxial layer 23 is grown by an epitaxy method on the P-type semiconductor substrate 22. In a case of such a setting (condition for forming a film), boron which is P-type impurities hardly diffuses (moves) from the P-type semiconductor substrate 22 side which is a deep position (deep layer portion) of the N/P$^+$ substrate 21 to the N-type epitaxial layer 23 side which is a shallow position (surface layer portion) of the N/P$^+$ substrate 21. Therefore, at an interface between the P-type semiconductor substrate 22 and the N-type epitaxial layer 23, a profile of a boron concentration is precipitous as will be described later. Further, in the N/P$^+$ substrate 21 prepared as it is, a PN junction surface (24) corresponds to the interface between the P-type semiconductor substrate 22 and the N-type epitaxial layer 23. Namely, in the N/P$^+$ substrate 21 in a stocked state, the PN junction surface (24) is, as described above, positioned at a depth of about 5.0 μm from the surface of the N/P$^+$ substrate 21.

At the time of actually manufacturing a CMOS image sensor, heat treatment is applied onto the N/P$^+$ substrate 21 in advance. In this manner, boron in the P-type semiconductor substrate 22 is made to diffuse into the N-type epitaxial layer 23. This heat treatment is carried out, for example, at a temperature of about 1150° C. for about 1.5 hours. As a result of the heat treatment, boron exudes from the P-type semiconductor substrate 22 into the N-type epitaxial layer 23, and a P-type well (P-well) 25 serving as a third P-type semiconductor layer is formed on the upper surface of the P-type semiconductor substrate 22. In the N/P$^+$ substrate 21 onto which the heat treatment has been applied, the PN junction surface 24 corresponds to an interface between the P-well 25 and the N-type epitaxial layer 23. Further, a thickness, which is shown by a solid arrow T2 in FIG. 2, of the N-type epitaxial layer 23 after the P-type well 25 has been formed is about 2.5 to 3.5 μm. Namely, in the N/P$^+$ substrate 21 onto which the heat treatment has been applied, the PN junction surface 24 is positioned at a depth of about 2.5 to 3.5 μm from the surface of the N/P$^+$ substrate 21. Then, a boron concentration in the vicinity of the PN junction surface 24 of the P-type well 25 is about $2 \times 10^{15}$ cm$^{-3}$.

In this way, a concentration of the P-type impurities in the P-type well 25 formed on the P-type semiconductor substrate 22 is set to about $2 \times 10^{15}$ cm$^{-3}$ in accordance with a boron concentration in the vicinity of the PN junction surface 24. In contrast thereto, a boron concentration which is a concentration of the P-type impurities in the P-type semiconductor substrate 22 is, as described above, set to about $2 \times 10^{18}$ cm$^{-3}$. Namely, a concentration of the P-type impurities in a deep layer portion deeper than about 5.0 μm from the surface in the N/P$^+$ substrate 21 is set to be higher than a concentration of the P-type impurities at a shallow position of a depth from about 2.5 to 3.5 μm to about 5.0 μm, which is directly thereabove.

Generally, in a region at which a concentration of P-type impurities is high, a lifetime of electrons serving as carriers is short, and the electrons are immediately recombined with positive holes. Accordingly, even if electrons generated in the N/P$^+$ substrate 21 diffuse up to a deep layer portion which is lower than a position of about 5.0 μm from the surface of the N/P$^+$ substrate 21, the electrons are immediately recombined with positive holes. Further, even if electrons generated at a shallow position up to 5.0 μm from the surface of the N/P$^+$ substrate 21 make an attempt to diffuse into a deep portion of the N/P$^+$ substrate 21, the electrons are rebounded in the vicinity of the interface between the P-type well 25 in which a concentration of the P-type impurities is rapidly changed and the N-type epitaxial layer 23, toward the surface side of the N/P$^+$ substrate 21. To describe concretely, even if electrons generated at a shallow position up to about 5.0 μm from the surface of the N/P$^+$ substrate 21 make an attempt to diffuse into a deep layer portion of the N/P$^+$ substrate 21, the electrons are made to return to the surface side of the N/P$^+$ substrate 21 by a potential barrier existing in the vicinity of the PN junction surface 24.

Here, in the CMOS image sensor manufactured by using the N/P$^+$ substrate 21 having such a structure, the image pickup area 11, a peripheral circuit analog area (a second peripheral circuit area) 13, a peripheral circuit logic area (a first peripheral circuit area) 14, and chip cut sections 15 are provided for each chip. Then, a P-type well (a second P-type semiconductor layer) 13' and a P-type well (a first P-type semiconductor layer) 14' are formed at the peripheral circuit analog area 13 and the peripheral circuit logic area 14, respectively. In the present embodiment, both of the P-type wells 13' and 14' are formed continuously so as to have depths reaching the P-type semiconductor substrate 22 (or the P-type well 25) from the surface layer portion of the N/P$^+$ substrate 21 (the surface portion of the N-type epitaxial layer 23). Note that the chip cut section 15 is usually called a dicing line section.

By the way, in the vicinity of the surface portion of the N-type epitaxial layer 23 corresponding to the image pickup area 11, gates 26 of read transistors, drains serving as detection units 27, and the like are formed by normal (existing) processes. In accordance therewith, in the vicinity of the surface portion of the N-type epitaxial layer 23, although not shown, capacitors, gate wirings, and the like are formed by normal processes.

Further, on a plurality of places of the surface portion of the N-type epitaxial layer 23 corresponding to the image pickup area 11, photo diodes (PDs) 28 serving as photoelectric converters are provided so as to be independent of one another by usual processes. To describe concretely, patterning of an unillustrated resist film is carried out so as to be a predetermined pattern onto the surface of the N-type epitaxial layer 23. Thereafter, ion implantation of phosphorus which is N-type impurities is carried out into the surface portion of the N-type epitaxial layer 23. At that time, a depth of a peak of a phosphorus concentration (P-concentration) which is a concentration of the N-type impurities is determined mainly by an amount of energy at the time of implanting P-ion. In the present embodiment, a dose amount of P-ion is set to $1.2 \times 10^{12}$ cm$^{-2}$ on the basis of an implantation energy of about 300 KeV as a condition for implanting P-ion. In accordance therewith, the photo diodes 28 formed from the second N-type semiconductor layer are formed at a plurality of places on the surface portion of the N-type epitaxial layer 23. Namely, a plurality of the photo diodes 28 are provided on the surface portion of the N-type epitaxial layer 23 so as to have a profile of a phosphorus concentration by which a peak of a phosphorus concentration is at a depth of about 0.4 µm from the surface of the N-type epitaxial layer 23.

Further, on the surface portion of the N-type epitaxial layer 23 corresponding to the image pickup area 11, a plurality of shallow trench isolations (STIs) 29 serving as isolation areas which are formed from, for example, oxide films are formed. These STIs 29 are formed so as to have a depth of about 0.3 to 0.35 µm from the surface of the N-type epitaxial layer 23.

Moreover, on the N-type epitaxial layer 23 corresponding to the image pickup area 11, fourth P-type semiconductor layers 30 which are patterns surrounding the photo diodes 28 individually, and are formed from a plurality of layers, are provided. The fourth P-type semiconductor layers 30 are respectively provided from the vicinity of the surface of the N-type epitaxial layer 23 toward the P-type well 25 side. To describe concretely, the fourth P-type semiconductor layers 30 are respectively provided under the respective STIs 29 and the detection units 27. The fourth P-type semiconductor layers 30 are respectively formed by carrying out ion implantation of, for example, boron which is P-type impurities into the N-type epitaxial layer 23 a plurality of times. In the fourth P-type semiconductor layers 30, boron concentrations at central portions 30a of the respective layers are higher than boron concentrations at the peripheral portions thereof.

In the present embodiment, the fourth P-type semiconductor layers 30 formed from five layers are formed. Accordingly, in order to form these fourth P-type semiconductor layers 30 formed from five layers, ion implantation of boron is carried out five times. Implantation energies and dose amounts of B-ion in these five-time ion implantations are respectively set to about $7 \times 10^{12}$ cm$^{-2}$ at about 200 KeV, about $5 \times 10^{11}$ cm$^{-2}$ at about 400 KeV, about $5 \times 10^{11}$ cm$^{-2}$ at about 650 KeV, about $5 \times 10^{11}$ cm$^{-2}$ at about 1100 KeV, and about $5 \times 10^{11}$ cm$^{-2}$ at about 1700 KeV in the order of the first-time to the fifth-time. Under such a setting (condition for implantation), at a point in time when the five-time ion implantations are completed, spaces among the respective STIs 29 and the detection units 27, and the surface portion of the P-type well 25 are respectively filled with the fourth P-type semiconductor layers 30 formed from five layers with no space. Namely, at a point in time when the five-time ion implantations are completed, the N-type epitaxial layer 23 among the respective STIs 29 and the detection units 27, and the surface portion of the P-type well 25 are practically made to be P-type semiconductor layers by the fourth P-type semiconductor layers 30 formed from five layers. Note that the fourth P-type semiconductor layers 30 directly beneath the detection units 27, among the fourth P-type semiconductor layers 30 respectively provided under the detection units 27, i.e., the fourth P-type semiconductor layers 30 which are the uppermost layers function as so-called punch-through stopper layers as well.

In the ion implantation process described above, boron in the P-type semiconductor substrate 22 exudes from the inside of the P-type semiconductor substrate 22 toward the N-type epitaxial layer 23 side due to heat diffusion. In accordance therewith, the PN junction surface 24 which is a junction interface between the N-type epitaxial layer 23 and the P-type well 25 further moves up toward the N/P$^+$ substrate 21 side as compared with the position before the ion implantations have been carried out. To describe concretely, a thickness of the N-type epitaxial layer 23 at a point in time when the five-time ion implantations are completed is about 2.0 µm. Namely, the PN junction surface 24 at a point in time when the five-time ion implantations are completed is positioned at a depth of about 2.0 µm from the surface of the N/P$^+$ substrate 21. Accordingly, the N-type epitaxial layer 23 having a thickness of about 2.0 µm from the surface of the N/P$^+$ substrate 21 to the PN junction surface 24 can be made to be substantially a P-type semiconductor layer by the fourth P-type semiconductor layers 30 formed from five layers.

In this way, the fourth P-type semiconductor layers 30 formed from five layers are respectively provided along the STIs 29 and the detection units 27, and are continuously provided without interruption so as to have depths reaching the P-type well 25 from the places directly beneath the STIs 29 and the detection units 27. In accordance therewith, the photo diodes 28 are respectively isolated electrically from the other photo diodes 28 adjacent to one another. Namely, the fourth P-type semiconductor layers 30 which are provided so as to respectively surround the photo diodes 28 individually function as barrier layers which electrically separate the spaces among the photo diodes 28 along with the P-well 25.

Further, in the case of the present embodiment, the fourth P-type semiconductor layers 30 formed from five layers are, in the same way, provided at the chip cut sections 15 which divide the wafer form N/P$^+$ substrate 21 into a plurality of chips. The fourth P-type semiconductor layers 30 at the chip cut sections 15 are formed simultaneously with the fourth P-type semiconductor layers 30 provided under the STIs 29 and the detection units 27. Namely, in the present embodiment, when the fourth P-type semiconductor layers 30 respectively serving as barrier layers are provided under the STIs 29 and the detection units 27, additionally, ion implantations of boron are carried out into the N-type epitaxial layer 23 corresponding to the dicing line sections. In accordance therewith, in the same way as the respective fourth P-type semiconductor layers 30 provided under the respective STIs 29 and detection units 27, the fourth P-type semiconductor layers 30 formed from five layers are continuously provided without interruption at the chip cut sections 15 so as to have depths reaching the P-type well 25 from the surface portion of the N-type epitaxial layer 23. In this way, at the chip cut sections 15 of the N/P$^+$ substrate 21 as well, the N-type epitaxial layer 23 having a thickness of about 2.0 µm from the surface of the N/P$^+$ substrate 21 to the PN junction surface 24 can be made to be substantially a P-type semiconductor layer by the fourth P-type semiconductor layers 30 formed from five layers.

In a case of such a structure, the fourth P-type semiconductor layers 30 serving as barrier layers and the fourth P-type semiconductor layers 30 at the chip cut sections 15 can be easily simultaneously formed without increasing the number of processes.

Further, the N/P$^+$ substrate 21 is divided into a plurality of chips along the chip cut sections 15 in the subsequent step. The chip cut section 15 from the surface to the rear surface of the N/P$^+$ substrate 21 is formed from the fourth P-type semiconductor layer 30, the P-type well 25, and the P-type semiconductor substrate 22. Therefore, even if the N/P$^+$ substrate 21 is chopped off at the chip cut section 15, the PN junction surface 24 does not appear at the chip cut section 15.

Moreover, shield layers (PD-p layers) 32 are respectively provided on the surface portions of the photo diodes 28 in order to make the photo diodes 28 have S3 (Surface Shield Sensor) structures. To describe concretely, first, patterning of an unillustrated resist film is carried out so as to be a predetermined pattern on the N-type epitaxial layer 23 except for the photo diodes 28. Thereafter, ion implantations of boron which is P-type impurities are carried out into the surface portions of the photo diodes 28. At that time, implantation energies and dose amounts of B-ion are set to $1 \times 10^{13}$ cm$^{-2}$ at about 10 KeV. In accordance therewith, the surface portions (surface levels) of the photo diodes 28 which are N-type semiconductor layers are respectively covered to be shielded with the shield layers 32 which are P-type semiconductor layers formed from boron. Namely, the N-type semiconductor layers (28) which practically carry out photoelectric conversion are filled into the surface portions of the N-type epitaxial layer 23 by forming the shield layers 32 onto the surface portions of the photo diodes 28. In accordance therewith, the photo diodes 28 having S3 structures in which the surfaces of the N-type semiconductor layers (28) are shielded with the P-type semiconductors (32) formed from boron are formed. In such a structure, a concentration of boron which is P-type impurities in the vicinity of the surfaces of the photo diodes 28 is increased again. To describe concretely, a boron concentration in the vicinity of the surfaces of the photo diodes 28 is about $1\times10^{19}$ $cm^{-3}$.

On the other hand, as described above, the P-type wells 13' and 14' are respectively formed at the portions corresponding to the peripheral circuit analog area 13 and the peripheral circuit logic area 14. The P-type wells 13' and 14' are formed so as to be adjacent to the image pickup area 11. To describe concretely, patterning of an unillustrated resist film is carried out so as to be a predetermined pattern on the surface of the N-type epitaxial layer 23. Thereafter, ion implantation of boron which is P-type impurities is carried out into the surface portion of the N-type epitaxial layer 23. At that time, a depth of a peak of a boron concentration which is a concentration of P-type impurities is determined mainly by an amount of energy at the time of implanting B-ion.

In the present embodiment, implantation energies and dose amounts of B-ion are respectively set to about $1\times10^{13}$ $cm^{-2}$ at about 800 KeV and about $5\times10^{11}$ $cm^{-2}$ at about 1500 KeV as conditions for implanting B-ion. Under such settings (conditions for implantation), ion implantations of boron is carried out twice into the surface portions of the N-type epitaxial layer 23. In accordance therewith, the P-type wells 13' and 14' which are formed from the first and second P-type semiconductor layers having boron concentration profiles at a depth of about 2.0 μm from the surface of the N-type epitaxial layer 23 are respectively formed. Namely, the P-type wells 13' and 14' connected to the P-type semiconductor substrate 22 via the P-type well 25 are formed on the surface layer portion of the N/P+ substrate 21. Boron concentrations in the P-type wells 13' and 14' are set to, for example, about $2\times10^{15}$ $cm^{-3}$.

Then, ADC 12a is formed by a normal process at the peripheral circuit analog area 13 for forming the analog system peripheral circuit 12. For convenience, the details are not shown in the drawing. However, for example, P-type wells $12_{-1}$ for forming N-type MOS transistors and N-type wells $12_{-2}$ for forming P-type MOS transistors are respectively formed in the vicinity of the surface of the P-type well 13' corresponding to the peripheral circuit analog area 13. Namely, due to the N-type MOS transistors being formed in the P-type wells $12_{-1}$, and the P-type MOS transistors being formed in the N-type wells $12_{-2}$, the ADC 12a can be realized.

Further, the DAC 12b, the timing control circuit 12c, the TG/SG 12d, the DSP 12e, the encoding circuit 12f, the AGC circuit 12g, the CLP circuit 12h, and the output circuit 12i are formed by normal processes at the peripheral circuit logic area 14 for forming the logic system peripheral circuits 12. For convenience, the details are not shown in the drawing. However, for example, P-type wells $12_{-1}$ for forming N-type MOS transistors and N-type wells $12_{-2}$ for forming P-type MOS transistors are respectively formed in the vicinity of the surface of the P-type well 14' corresponding to the peripheral circuit logic area 14. Namely, due to an N-type MOS transistor being formed in the P-type well $12_{-1}$, and a P-type MOS transistor being formed in the N-type well $12_{-2}$, mounting of the DAC 12b, the timing control circuit 12c, the TG/SG 12d, the DSP 12e, the encoding circuit 12f, the AGC circuit 12g, the CLP circuit 12h, and the output circuit 12i are achieved.

Finally, after predetermined processes of forming aluminum (Al) wiring by a normal process, and the like, the N/P+ substrate 21 is diced along the chip cut sections 15 to be divided individually in units of chips. In accordance therewith, a CMOS image sensor according to the present embodiment is completed. As a result, a CMOS image sensor formed from a desired structure as described above can be obtained. Namely, in the CMOS image sensor using the N/P+ substrate 21, the photo diodes 28 are electrically isolated so as to be individually surrounded by the P-type well 25 and the fourth P-type semiconductor layers 30, and further, it is possible to prevent the PN junction surface 24 from appearing on the cut surfaces of the chips. In addition, a CMOS image sensor is obtained in which the P-type well 13' at which the analog system peripheral circuit 12 is formed and the P-type well 14' at which the logic system peripheral circuits 12 are formed are connected to the P-type semiconductor substrate 22 via the P-type well 25.

Figure 3:
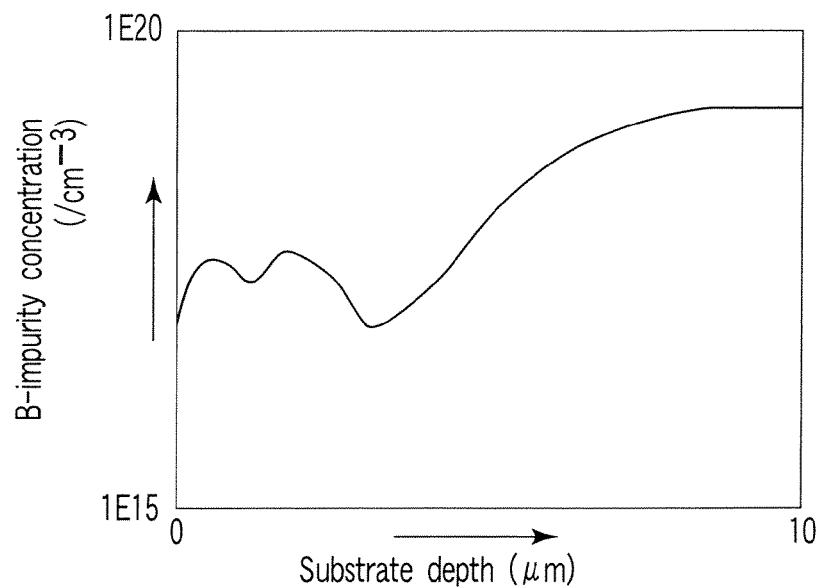
FIG. 3 is a graph showing a characteristic of a portion taken along the line III-III of the CMOS image sensor shown in FIG. 2.

FIG. 3 shows an impurity concentration profile along a direction of the thickness of the N/P+ substrate 21 in the CMOS image sensor having a structure described above. Here, a boron concentration with respect to a direction of the depth at a portion corresponding to the peripheral circuit analog area 13 (in particular, the P-type wells $12_{-1}$) which is shown by the line III-III in FIG. 2 is shown.

Namely, with respect to the portion corresponding to the peripheral circuit analog area 13, respective boron concentrations in the P-type wells $12_{-1}$, the P-type well 13', the P-type well 25, and the P-type semiconductor substrate 22 are set as shown in the graph. Note that boron concentrations with respect to a direction of the depth at a portion corresponding to the peripheral circuit logic area 14 (in particular, the P-type well $12_{-1}$) are set in substantially the same way.

Figure 4:
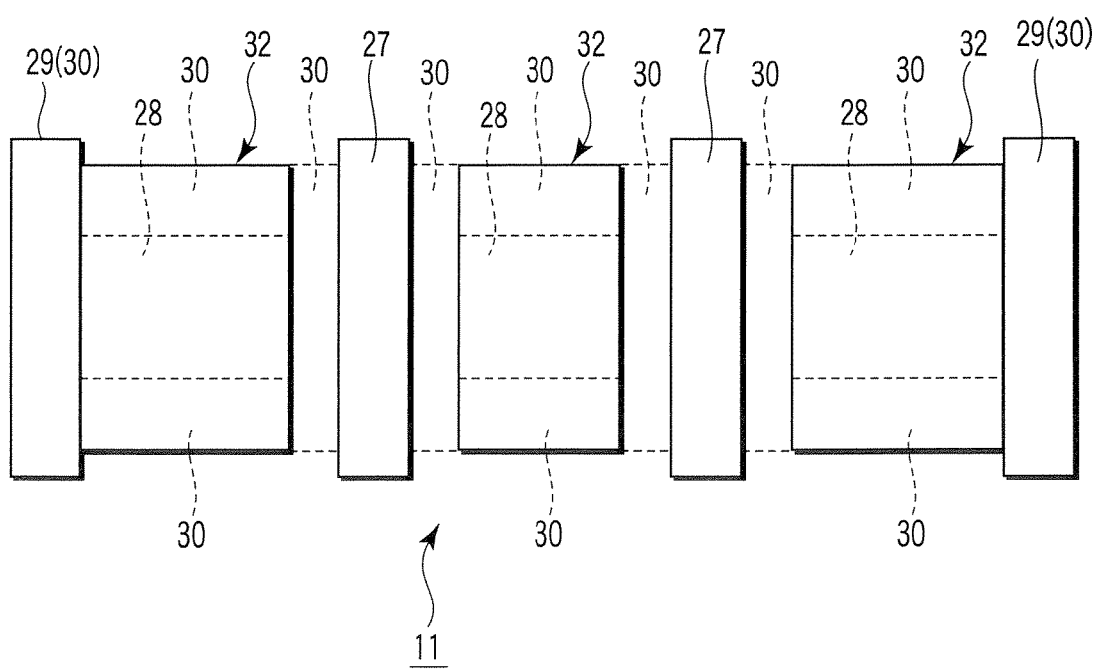
FIG. 4 is a plan view showing a part of an image pickup area of the CMOS image sensor shown in FIG. 2.

FIG. 4 shows a part of the image pickup area 11 of the CMOS image sensor described above in a planar manner. As is clear from FIG. 4, the four sides of the photo diodes 28 are surrounded by the fourth P-type semiconductor layers 30. In accordance therewith, each of the photo diodes 28 is insulated so as to be electrically isolated from the other photo diodes 28 adjacent to one another by the respective fourth P-type semiconductor layers 30 provided at the periphery thereof.

Figure 5:
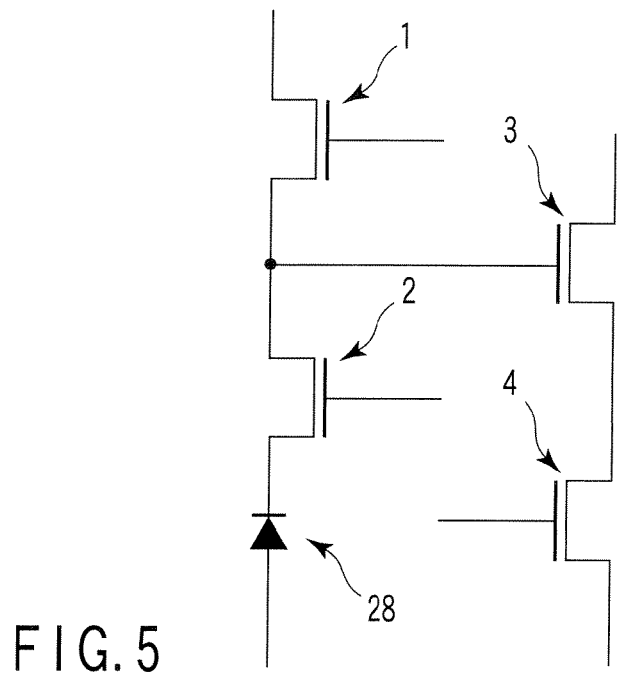
FIG. 5 is a simplified circuit diagram showing a structure of a principal part of the CMOS image sensor shown in FIG. 2.

FIG. 5 shows a simplified structure of a pixel in the CMOS image sensor described above. Each pixel of the CMOS image sensor is structured so as to have a reset transistor 1, a read transistor 2, an amplifier transistor 3, an address transistor 4, and the photo diode 28. The reset transistor 1 and the read transistor 2 are directly connected between a source and a drain thereof. In the same way, a source and a drain of the amplifier transistor 3 and the address transistor 4 are directly connected. Further, a gate of the amplifier transistor 3 is connected to a connection point between the source and the drain of the reset transistor 1 and the read transistor 2. Moreover, a terminal at the forward direction side of the photo diode 28 is connected to the source (or the drain) of the read transistor 2.

Next, an impurity concentration, an electron distribution, and a potential along the direction of the thickness of the N/P+ substrate of the CMOS image sensor of the present embodiment will be described with reference to FIG. 6. Note that FIG. 6 shows respectively an impurity concentration, an electron distribution, and a potential at a portion along the line VI-VI of the CMOS image sensor shown in FIG. 2.

First, a graph at the upper side of FIG. 6 will be described. In the graph at the upper side of FIG. 6, an area shown by "B" in the graph shows an impurity concentration in the shield layer 32 formed from the P-type semiconductor layer. Further, an area shown by "C" in the graph shows an impurity concentration in the photo diode 28 formed from the N-type semiconductor layer. Further, an area shown by "D" in the graph shows an impurity concentration in the N-type epitaxial layer 23. Further, an area shown by "E" in the graph shows an impurity concentration in the P-type well 25. Then, an area shown by "F" in the graph shows an impurity concentration in the P-type semiconductor substrate 22.

Figure 6:
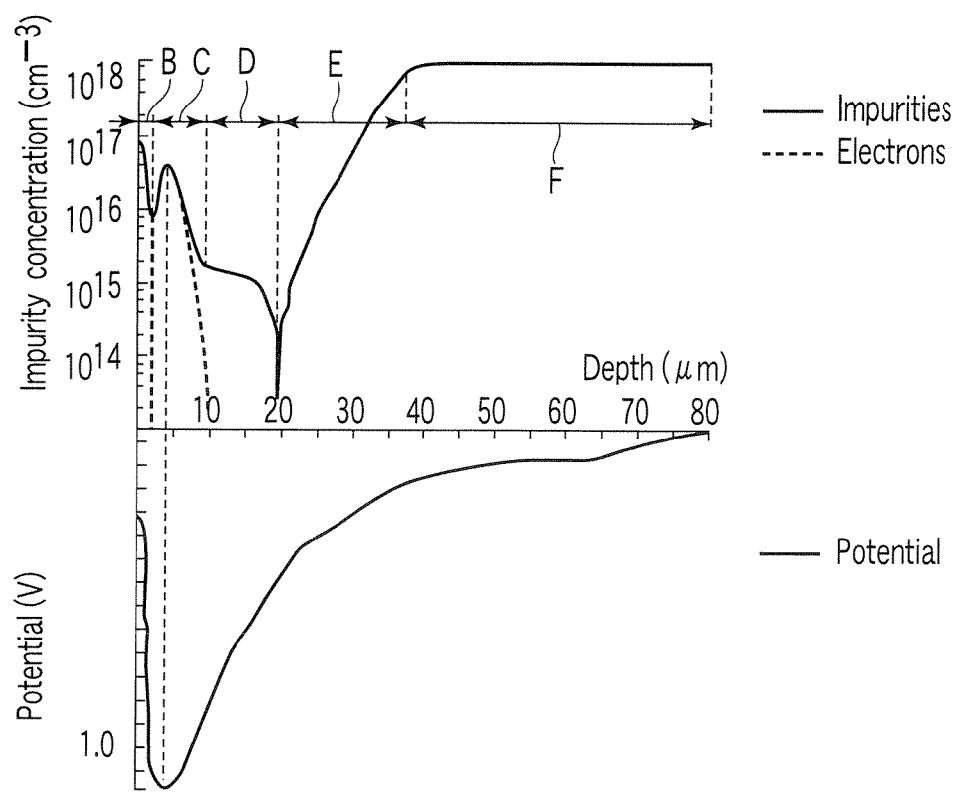
FIG. 6 is a graph showing a characteristic of a portion taken along line VI-VI of the CMOS image sensor shown in FIG. 2.

As is clear from the graph at the upper side of FIG. 6, a boron concentration which is a P-type impurity concentration drops off gradually from the deep layer portion of the P-type semiconductor substrate 22 to the surface of the P-type well 25. Then, at the interface (24) between the P-type well 25 and the N-type epitaxial layer 23 which is positioned at a depth of about 2.0 μm, because impurities thereof are different from one another, an impurity concentration rapidly varies, which makes a precipitous profile. Further, at the interface between the N-type epitaxial layer 23 and the photo diode 28 formed from the N-type semiconductor layer, because the impurities are the same, an impurity concentration smoothly varies. Then, at the photo diode 28, a phosphorus concentration which is an N-type impurity concentration reaches a peak at a depth of about 0.4 μm. Moreover, at the interface between the photo diode 28 and the shield layer 32 formed from the P-type semiconductor layer, because impurities thereof are different from one another, an impurity concentration drops off once. Then, at the shield layer 32, a boron concentration which is a P-type impurity concentration reaches a peak in the vicinity of the surface thereof. Further, as is clear from the graph at the upper side of FIG. 6, a peak (local maximum) in a distribution of electrons (carriers) in the N/P$^+$ substrate 21 is substantially coincident with a peak (local maximum) of an N-type impurity concentration (phosphorus concentration) in the photo diode 28.

Next, a graph at the lower side of FIG. 6 will be described. The graph at the lower side of FIG. 6 shows a distribution of potentials in the N/P$^+$ substrate 21. As is clear from the graph at the lower side of FIG. 6 and the graph at the upper side of FIG. 6, a position at which a potential in the N/P$^+$ substrate 21 is made to be a local minimum (the least) is substantially coincident with a peak (local maximum) of an N-type impurity concentration (phosphorus concentration) in the photo diode 28 and a peak (local maximum) of a distribution of electrons in the N/P$^+$ substrate 21.

Movements (behaviors) of electrons in the N/P$^+$ substrate 21 are extremely well matched to a physical phenomenon generally known. Namely, even if electrons generated in the N/P$^+$ substrate 21 make an attempt to diffuse toward the P-type semiconductor substrate 22 side which is the deep layer portion side of the N/P$^+$ substrate 21 by a photoelectric conversion effect of the photo diode 28, the electrons are rebounded toward the surface layer portion side of the N/P$^+$ substrate 21 by a potential barrier. Then, the electrons leaked from the photo diode 28 finally converge again on the inside of the photo diode 28 whose potential is made low in the N/P$^+$ substrate 21, by diffusion or the like. The electrons leaked from the photo diode 28 are made to converge again on, in particular, a position at which an impurity concentration in the photo diode 28 whose potential is made to be a local minimum (the least) in the N/P$^+$ substrate 21 reaches a peak. As a result, in the CMOS image sensor in the present embodiment using the N/P$^+$ substrate 21, it is possible to increase a sensitivity of the photo diode 28.

As described above, in accordance with the first embodiment, the P-type well 13' at which the analog system peripheral circuit 12 is formed and the P-type well 14' at which the logic system peripheral circuits 12 are formed can be grounded via the P-type semiconductor substrate 22. Accordingly, it is possible to make pulse signals generated in the logic circuits and the analog circuit favorable so as to have stable waveforms, which makes it possible to solve the problem that timings of generating pulses are shifted. Additionally, in the CMOS image sensor using the N/P$^+$ substrate 21, the photo diodes 28 can be electrically isolated by the P-type well 25 and the fourth semiconductor layers 30, and it is possible to prevent the PN junction surface 24 from appearing at the cut surfaces of the chips. Therefore, the CMOS image sensor is obtained in which it is possible to suppress color mixture, a decrease in sensitivity, and blooming which are brought about due to electrons being leaked into adjacent pixels (photo diodes). As a result, the CMOS image sensor using the N/P$^+$ substrate 21 can be structured such that color mixture/sensitivity/blooming characteristics are excellent, and can be structured such that the peripheral circuits can maintain high frequency characteristics, which is more suitable for being made to be a multi-pixel type or a high-speed design.

Second Embodiment

Figure 7:
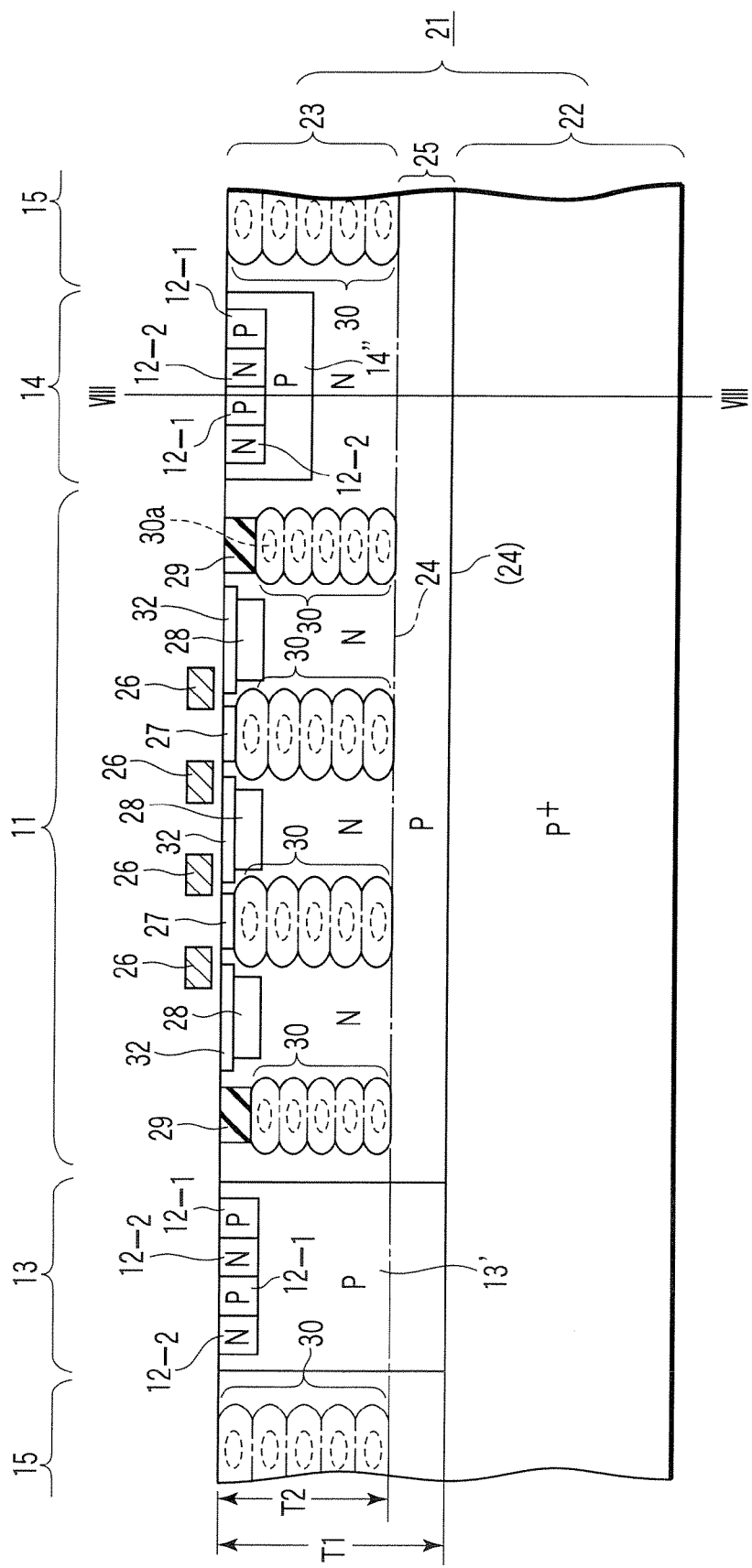
FIG. 7 is a cross-sectional view showing a configuration example of a CMOS image sensor using an N/P+ substrate according to a second embodiment of the present invention.

FIG. 7 shows a basic structure of a CMOS image sensor (an amplified type solid-state image pickup device) using an N/P$^+$ substrate according to a second embodiment of the present invention. In the present embodiment, a CMOS image sensor which is made to be one chip will be described as an example. Further, a case in which a deep P-type well (the second P-type semiconductor layer) 13' is formed at the surface layer portion of the N/P$^+$ substrate 21 corresponding to the peripheral circuit analog area 13, and a P-type well (the first P-type semiconductor layer) 14" which is shallower than the P-type well 13' is formed at the surface layer portion of the N/P$^+$ substrate 21 corresponding to the peripheral circuit logic area 14 respectively, will be described. Note that portions which are the same as those in FIG. 2 are denoted by the same reference numerals, and detailed descriptions here will be omitted.

Namely, the second embodiment is structured such that only the P-type well 13' at the peripheral circuit analog area 13 in the peripheral circuit analog area 13 and the peripheral circuit logic area 14 is connected to the P-type semiconductor substrate 22 via the P-type well 25, and is different in this point from the first embodiment described above.

Further, FIG. 8 shows an impurity concentration profile along a direction of the thickness of the N/P$^+$ substrate of the CMOS image sensor according to the present embodiment. Here, there is shown a boron concentration with respect to a direction of the depth at a portion corresponding to the peripheral circuit logic area 14 (in particular, the P-type wells $12_{-1}$) shown by the line VIII-VIII of FIG. 7. As is clear from this graph, at an interface between the N-type epitaxial layer 23 and the P-type well 14", and an interface between the N-type epitaxial layer 23 and the P-type well 25, changes in the impurity concentrations are respectively precipitous. This is because there is a reverse conductivity type N-type epitaxial layer 23 between the P-type well 14" and the P-type well 25 corresponding to the peripheral circuit logic area 14.

In a case of the present embodiment, as shown in FIG. 7, the P-type well 13' is continuously formed so as to have a depth reaching the P-type well 25 (or the P-type semiconductor substrate 22) from the surface layer portion of the N/P$^+$ substrate 21 at the area corresponding to the peripheral circuit analog area 13. In contrast thereto, the P-type well 14" is formed so as to have a depth of, for example, about 1 μm from the surface layer portion of the N/P⁺ substrate 21 at the area corresponding to the peripheral circuit logic area 14.

Namely, the P-type well 13' is formed so as to be adjacent to the image pickup area 11 on the surface layer portion of the N/P⁺ substrate 21 corresponding to the peripheral circuit analog area 13. The P-type well 13' is formed up to a deep position (about 2.0 μm) so as to contact the P-type well 25. On the other hand, the P-type well 14" is formed so as to be adjacent to the image pickup area 11 on the surface layer portion of the N/P⁺ substrate 21 corresponding to the peripheral circuit logic area 14. The P-type well 14" is not formed up to a deep position in order not to contact the P-type well 25. To describe concretely, patterning of an unillustrated resist film is carried out so as to be a predetermined pattern on the surface of the N-type epitaxial layer 23. Thereafter, ion implantation of boron which is P-type impurities is carried out into the surface portions of the N-type epitaxial layer 23. At that time, a depth of a peak of a boron concentration which is a concentration of P-type impurities is determined mainly by an amount of energy at the time of implanting B-ion.

Implantation energy and a dose amount of B-ion for the first time are set to about $1 \times 10^{13}$ cm$^{-2}$ at about 800 KeV, and implantation energy and a dose amount of B-ion for the second time are about $5 \times 10^{11}$ cm$^{-2}$ at about 1500 KeV respectively as conditions for implanting B-ion. Under this settings (conditions for implantation), the deep P-type well 13' is formed by carrying out two-time (first-time and second-time) ion implantations into the portion corresponding to the peripheral circuit analog area 13 while repeatedly carrying out forming and peeling of the predetermined patterned resist film. On the other hand, the P-type well 14" which is shallower than the deep P-type well 13' is formed by carrying out one-time (only one time of the first-time and second-time) ion implantation into a portion corresponding to the peripheral circuit logic area 14. In accordance therewith, the P-type well 13' having a boron concentration profile at a depth of about 2.0 μm from the surface of the N-type epitaxial layer 23 is formed on the surface layer portion of the N/P⁺ substrate 21 corresponding to the peripheral circuit analog area 13. In contrast thereto, the P-type well 14" having a boron concentration profile at a depth of about 1.0 μm from the surface of the N-type epitaxial layer 23 is formed on the surface layer portion of the N/P⁺ substrate 21 corresponding to the peripheral circuit logic area 14.

In this way, the P-type well 13' which is connected to the P-type semiconductor substrate 22 via the P-type well 25 and the P-type well 14" which is not connected to the P-type semiconductor substrate 22 due to the N-type epitaxial layer 23 being made to remain between with the P-type well 25 are respectively provided on the surface layer portion of the N/P⁺ substrate 21. Boron concentrations (P-type impurity concentrations) in the P-type wells 13' and 14" are set to, for example, $2 \times 10^{15}$ cm$^{-3}$.

Then, the ADC 12a is formed by a normal process at the peripheral circuit analog area 13 for forming the analog system peripheral circuit 12. Further, the DAC 12b, the timing control circuit 12c, the TG/SG 12d, the DSP 12e, the encoding circuit 12f, the AGC circuit 12g, the CLP circuit 12h, and the output circuit 12i are formed by normal processes at the peripheral circuit logic area 14 for forming the logic system peripheral circuits 12. For convenience, the details are not shown in the drawing. However, for example, P-type wells $12_{-1}$ for forming N-type MOS transistors and N-type wells $12_{-2}$ for forming P-type MOS transistors are respectively formed in the vicinity of the surface of the P-type well 13' corresponding to the peripheral circuit analog area 13, and in the vicinity of the surface of the P-type well 14" corresponding to the peripheral circuit logic area 14.

Note that, in the surface portion of the N-type epitaxial layer 23 corresponding to the peripheral circuit logic area 14 (in the vicinity of the surface of the P-type well 14"), ion implantation of phosphorus is further carried out under the conditions that implantation energy and a dose amount are about $5 \times 10^{13}$ cm$^{-2}$ at about 1500 KeV. In accordance therewith, it is possible to increase a concentration (about $2 \times 10^{13}$ cm$^{-3}$) of the N-type epitaxial layer 23 which is originally low, which makes it possible to maintain the resistance to isolation pressure between the wells ($12_{-1}$, $12_{-2}$). However, this process can be omitted depending on a design rule.

As described above, in a case of a structure as in the present embodiment, because the P-type well 13' is connected to the P-type semiconductor substrate 22 with respect to the analog system peripheral circuit 12, a stable zero potential can be obtained. With respect to the logic system peripheral circuits 12, the P-type well 14" is not connected to the P-type semiconductor substrate 22. Therefore, it is possible to solve the problem of deterioration in image property such as vertical stripes and horizontal stripes due to noises generated in the logic system peripheral circuits 12 plunging into the image pickup area 11 and the peripheral circuit analog area 13. Note that, in a case of the logic system peripheral circuits 12, because there are no cases in which the characteristics are deteriorated by slight warps in pulse waveforms and delays in timings as in a case of the analog system peripheral circuit 12, some shaking in a zero potential have no effect on the image property in any case.

Namely, in the CMOS image sensor using the N/P⁺ substrate 21, when the P-type well 13' at which the analog system peripheral circuit 12 is formed is connected to the P-type semiconductor substrate 22, it is possible to obtain a stable zero potential. Accordingly, a pulse signal formed in the analog system peripheral circuit 12 can be made to have a stable and favorable waveform, and there are no cases in which delays in timings are brought about. Further, in the CMOS image sensor using the N/P⁺ substrate 21, because carriers generated in the N/P⁺ substrate 21 are immediately recombined, it is possible to suppress deterioration in image quality such as color mixture/blooming and the like generated due to electrons leaking into adjacent pixels (28). Additionally, in the CMOS image sensor using the N/P⁺ substrate 21, when the P-type well 14" in the peripheral circuit logic area 14 is isolated from the P-type semiconductor substrate 22, it is possible to prevent noises generated in the logic system peripheral circuits 12 from plunging into the peripheral circuit analog area 13 and the image pickup area 11 via the P-type semiconductor substrate 22 and the P-type well 25. In this manner, it is possible to prevent defects in the image property such as vertical stripes and horizontal stripes, and the like, from being brought about.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid-state image pickup device comprising:
a semiconductor substrate including a substrate main body having P type impurities and a first N type semiconductor layer provided on the substrate main body;
an image pickup area including a plurality of photoelectric converters in which said plurality of photoelectric converters include second N type semiconductor layers, the second N type semiconductor layers being provided on a surface portion of the first N type semiconductor layer independently of one another;
a peripheral circuit logic area including a first P type semiconductor layer formed on the first N type semiconductor layer without reaching to the substrate main body, a first P-well for a N-type MOS transistor and a first N-well for a P-type MOS transistor being formed in a surface of the first P-type semiconductor layer; and
a peripheral circuit analog area including a second P type semiconductor layer formed on the substrate main body to be electrically connected to the substrate main body, a second P-well for a N-type MOS transistor and a second N-well for a P-type MOS transistor being formed in a surface of the second P-type semiconductor layer.

2. The solid-state image pickup device according to claim 1, wherein the second P type semiconductor layer is continuously formed to a depth reaching the substrate main body.

3. The solid-state image pickup device according to claim 1, further comprising a third P type semiconductor layer between the substrate main body and the first N type semiconductor layer, and
wherein the second P type semiconductor layer is connected to the substrate main body via the third P type semiconductor layer.

4. The solid-state image pickup device according to claim 1, wherein the first N type semiconductor layer is an epitaxial growth layer.

5. The solid-state image pickup device according to claim 1, further comprising a plurality of fourth P type semiconductor layers, said plurality of fourth P type semiconductor layers being provided in the image pickup area to isolate said plurality of photoelectric converters from one another.

6. The solid-state image pickup device according to claim 5, wherein said plurality of fourth P type semiconductor layers are respectively formed by laminating a plurality of impurity layers.

7. The solid-state image pickup device according to claim 1, wherein the first P type semiconductor layer and the first N type semiconductor layer widely differ in concentration, and the first N type semiconductor layer and the substrate main body widely differ in concentration.

8. The solid-state image pickup device according to claim 1, wherein a peak of a distribution of electrons in the substrate main body is substantially coincident with a peak of an impurity concentration in the second N type semiconductor layer.

9. The solid-state image pickup device according to claim 1, wherein a position at which a potential in the substrate main body is minimized is substantially coincident with a peak of an impurity concentration in the second N type semiconductor layer and a peak of a distribution of electrons in the substrate main body.

10. The solid-state image pickup device according to claim 1, wherein an impurity concentration of the substrate main body decreases gradually from a deep layer portion to a surface layer portion.

11. The solid-state image pickup device according to claim 1, wherein the first N type semiconductor layer and the substrate main body widely differ in impurity concentration.

12. The solid-state image pickup device according to claim 1, wherein the first N type semiconductor layer and the second N type semiconductor layer slightly differ in impurity concentration.

* * * * *